United States Patent
Johnson et al.

(10) Patent No.: US 10,551,464 B2
(45) Date of Patent: Feb. 4, 2020

(54) THREE DIMENSIONAL MULTISLAB, MULTI-SHOT MAGNETIC RESONANCE ELASTOGRAPHY

(71) Applicant: THE BOARD OF TRUSTEES OF THE UNIVERSITY OF ILLINOIS, Urbana, IL (US)

(72) Inventors: Curtis L. Johnson, Urbana, IL (US); Bradley Sutton, Savoy, IL (US); John G. Georgiadis, Champaign, IL (US); Joseph L. Holtrop, Champaign, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 326 days.

(21) Appl. No.: 15/032,202

(22) PCT Filed: Aug. 7, 2014

(86) PCT No.: PCT/US2014/050152
§ 371 (c)(1),
(2) Date: Apr. 26, 2016

(87) PCT Pub. No.: WO2015/065560
PCT Pub. Date: May 7, 2015

(65) Prior Publication Data
US 2016/0266225 A1  Sep. 15, 2016

Related U.S. Application Data

(60) Provisional application No. 61/898,053, filed on Oct. 31, 2013.

(51) Int. Cl.
*G01R 33/563* (2006.01)
*G01R 33/567* (2006.01)
(Continued)

(52) U.S. Cl.
CPC .... *G01R 33/56358* (2013.01); *G01R 33/5611* (2013.01); *G01R 33/5676* (2013.01); *G01R 33/56545* (2013.01)

(58) Field of Classification Search
None
See application file for complete search history.

(56) References Cited

U.S. PATENT DOCUMENTS 5,245,282 A   9/1993 Mugler et al.
5,592,085 A   1/1997 Ehman
(Continued)

OTHER PUBLICATIONS

Abolfathi, N. et al., "A Micromechanical Procedure for Modelling the Anisotropic Mechanical Properties of Brain White Matter", Computer Methods in Bomechanics and Biomedical Enginerring, vol. 12, No. 3, http://www.tandfonline.com/loi/gcmb20, Apr. 27, 2009, 249-242.

(Continued)

*Primary Examiner* — Paresh Patel
(74) *Attorney, Agent, or Firm* — Ralph Trementozzi; Guntin & Gust, PLC

(57) ABSTRACT

A method and system provides an acquisition scheme for generating MRE displacement data with whole-sample coverage, high spatial resolution, and adequate SNR in a short scan time. The method and system can acquire in-plane k-space shots over a volume of a sample divided into a plurality of slabs that each include a plurality of slices to obtain three dimensional multislab, multishot data, can apply refocusing pulses to the sample, can acquire navigators after the refocusing pulses, and can correct for phase errors based on an averaging of the navigators.

20 Claims, 7 Drawing Sheets

(51) Int. Cl.
    *G01R 33/561*   (2006.01)
    *G01R 33/565*   (2006.01)

(56) References Cited

U.S. PATENT DOCUMENTS

| | | | |
|---|---|---|---|
| 5,825,186 | A | 10/1998 | Ehman et al. |
| 5,977,770 | A | 11/1999 | Ehman |
| 6,185,447 | B1 | 2/2001 | Alley et al. |
| 6,879,155 | B2 | 4/2005 | Ehman et al. |
| 7,025,253 | B2 | 4/2006 | Sinkus et al. |
| 7,352,370 | B2 | 4/2008 | Wang et al. |
| 8,290,565 | B2 | 10/2012 | Ehman et al. |
| 8,384,384 | B2 * | 2/2013 | Zhao .................. G01R 33/4824 324/309 |
| 8,508,229 | B2 | 8/2013 | Ehman et al. |
| 8,971,602 | B2 * | 3/2015 | Glaser .................... A61B 5/055 382/131 |
| 10,261,157 | B2 * | 4/2019 | Sutton .............. G01R 33/56358 |
| 2004/0041563 | A1 | 3/2004 | Lewin et al. |
| 2006/0012367 | A1 | 1/2006 | Meaney et al. |
| 2007/0182411 | A1 * | 8/2007 | Bammer ............ G01R 33/4824 324/307 |
| 2009/0105582 | A1 * | 4/2009 | Dougherty ............. A61B 5/055 600/420 |
| 2011/0006767 | A1 | 1/2011 | Sack et al. |
| 2011/0270079 | A1 * | 11/2011 | Osman .................... A61B 5/702 600/421 |
| 2012/0053450 | A1 | 3/2012 | Salcudean et al. |
| 2012/0269415 | A1 * | 10/2012 | Glaser .................... A61B 5/055 382/131 |
| 2012/0313641 | A1 * | 12/2012 | Labadie ............. G01R 33/4818 324/309 |
| 2013/0131490 | A1 | 5/2013 | Huston, III et al. |
| 2013/0147478 | A1 * | 6/2013 | Zhou .................. G01R 33/4824 324/309 |
| 2013/0181712 | A1 | 7/2013 | Sutton et al. |
| 2014/0107467 | A1 | 4/2014 | Felmlee et al. |
| 2014/0114177 | A1 * | 4/2014 | Chen .................... A61B 5/0051 600/415 |
| 2014/0159725 | A1 | 6/2014 | Sack et al. |
| 2014/0232395 | A1 * | 8/2014 | Sutton .............. G01R 33/56358 324/309 |
| 2014/0316245 | A1 | 10/2014 | Romano et al. |
| 2018/0106879 | A1 | 4/2018 | Johnson et al. |

OTHER PUBLICATIONS

Johnson, C. L. et al., "Interleaved Spiral Sequence for MR Elastography of the Brain", University of Illinois at Urbana-Champaign, 2011, 1474.
Anderson, AW et al., Analysis and Correction of Motion Artifacts in Diffusion Weighted Imaging. Magn Reson Med 1994;32:379-387.
Chatelin, S. et al., Fifty Years of Brain Tissue Mechanical Testing: From in Vitro to in Vivo Investigations. Biorheology 2010;47:255-276, Jun. 2010.
Clarkson, et al., A Comparison of Voxel and Surface Based Cortical Thickness Estimation Methods. NeuroImage 2011;57:856-865.
Di Ieva, A. et al., Magnetic Resonance Elastography: a General Overview of Its Current and Future Applications in Brain Imaging. Neurosurg Rev 2010;33:137-145.
Doyley, MM. et al., Thresholds for Detecting and Characterizing Focal Lesions Using Steady-State MR Elastography. Med Phys 2003;30:495-504.
Ehman, et al., Vibration Safety Limits for Magnetic Resonance Elastography. Phys Med Biol 2008;53:925-935.
Freimann, FB et al., Sack I. Alteration of Brain Viscoelasticity After Shunt Treatment in Normal Pressure Hydrocephalus. Neuroradiology 2012;54:189-196.
Glover, et al., Simple Analytic Spiral K-Space Algorithm. Magn Reson Med 1999;42:412-415.
Jenkinson, M. et al., A Global Optimisation Method for Robust Affine Registration of Brain Images. Med Image Anal 2001;5:143-156.
Johnson, Curtis L., "Imaging the Local Mechanical Properties of the Brain With High-Resolution Magnetic Resonance Elastography", Dissertation for the degree of Doctor of Philosophy in Mechanical Engineering in the Graduate College of the University of Illinois at Urbana-Champaign, 2013, 137 pages.
Karampinos, DC et al., "High-Resolution Diffusion Tensor Imaging of the Human Pons with a Reduced Field-of-View, Multishot, Variable-Density, Spiral Acquisition at 3 T," Magn Reson Med 2009;62:1007-1016.
Kaster, et al., Measurement of the Hyperelastic Properties of Ex Vivo Brain Tissue Slices. J Biomech 2011;44:1158-1163, Jan. 2011.
Kim, D-H et al., Simple Analytic Variable Density Spiral Design. Magn Reson Med 2003;50:214-219.
Li, T. et al., High-Resolution Diffusion-Weighted Imaging with Interleaved Variable-Density Spiral Acquisitions. J Magn Reson Imaging 2005;21:468-475.
Liu, et al., Self-Navigated Interleaved Spiral (SNAILS): Application to High-Resolution Diffusion Tensor Imaging. Magn Reson Med 2004;52:1388-1396.
Yin, M. et al., "Assessment of Hepatic Fibrosis with Magnetic Resonance Elastography," Clin Gastroenterol H 2007;5:1207-1213.
Zhang, et al., Segmentation of Brain MR Images Through a Hidden Markov Random Field Model and the Expectation-Maximization Algorithm. IEEE T Med Imaging 2001;20:45-57.
Zhang, J. et al., Viscoelastic Properties of Human Cerebellum Using Magnetic Resonance Elastography. J Biomech 2011;44:1909-1913.
"International Preliminary Report on Patentability", PCT/US2014/050152, May 12, 2016, 7 pages.
Braun, et al., "High-resolution mechanical imaging of the human brain by three-dimensional multifrequency magnetic resonance elastography at 7T", 2013, 7 pages.
Dai, et al., "Simultaneous Multislice Accelerated Interleaved EPI DWI Using Generalized Blipped-CAIPI Acquisition and 3D K-Space Reconstruction", 2017, 13 pages.
Glover, Gary, "Simple Analytic Spiral K-Space Algorithm", 1999, 4 pages.
Holtrop, et al., "Diffusion Weighted Imaging Using Multi-shot Spiral with a Simultaneous Multi-slice Excitation", 2015, 1 page.
Johnson, et al., "3D Multislab, Multishot Acquisition for Fast, Whole-Brain MR Elastography with High Signal-to-Noise Efficiency", 2014, 9 pages.
Johnson, et al., "Magnetic Resonance Elastography of the Brain Using Multishot Spiral Readouts with Self-Navigated Motion Correction", 2013, 9 pages.
Liu, et al., "Self-Navigated Interleaved Spiral (SNAILS): Application to High-Resolution Diffusion Tensor Imaging", 2004, 9 pages.
Liu, G-R et al., Brain Magnetic Resonance Elastography on Healthy Volunteers: a Safety Study. Acta Radiol 2009;50:423-429.
Mariappan, et al., "Magnetic Resonance Elastography: a Review," Clin Anat 2010;23:497-511.
McGarry, et al., "Multiresolution MR elastography using nonlinear inversion", 2012, 10 pages.
McGarry, MDJ et al., "An Octahedral Shear Strain-Based Measure of SNR for 3D MR Elastography," Phys Med Biol 2011;56:N153-N164., 2011, 13 pages.
Murphy, et al., "Preoperative assessment of meningioma stiffness using magnetic resonance elastography", 2013, 6 pages.
Murphy, MC, Decreased Brain Stiffness in Alzheimer's Disease Determined by Magnetic Resonance Elastography. J Magn Reson Imaging 2011;34:494-498., 2011, 5 pages.
Muthupillai, et al., "Magnetic Resonance Elastography by Direct Visualization of Propagating Acoustic Strain Waves", 1995, 5 pages.
Normand, V. et al., New Insight Into Agarose Gel Mechanical Properties. Biomacromolecules 2000;1:730-738.
Papazoglou, et al., Multifrequency Inversion in Magnetic Resonance Elastography. Phys Med Biol 2012; 57:2329-2346.
Pfefferbaum, Adolf et al., "Increased Brain White Matter Diffusivity in Normal Adult Aging: Relationship to Anisotropy and Partial Voluming," Magn Reson Med 2003;49:953-961.
Plewes, DB et al., An Inductive Method to Measure Mechanical Excitation Spectra for MRI Elastography. Concept Magn Reson B 2004;216:32-39.

(56) References Cited

OTHER PUBLICATIONS

Prange, M. et al., Regional, Directional, and Age-Dependent Properties of the Brain Undergoing Large Deformation. J Biomech Eng-T ASME 2002;124:244-252.
Pruessmann, et al., "Advances in Sensitivity Encoding With Arbitrary k-Space Trajectories", 2001, 14 pages.
Romano, A. et al., In Vivo Waveguide Elastography of White Matter Tracts in the Human Brain. Magn Reson Med 2012, doi: 10.1002/mrm.24141.
Rump, et al., Fractional Encoding of Harmonic Motions in MR Elastography. Magn Reson Med 2007; 57:388-395.
Sack, I. et al., A Method for the Noninvasive and Spatially Resolved Observation of Phase Transitions in Gels. J Am Chem Soc 2001; 123:11087-11088.
Schregel, K. et al., Demyelination Reduces Brain Parenchymal Stiffness Quantified in Vivo by Magnetic Resonance Elastography. P Natl Acad Sci USA 2012; 109:6650-6655.
Sinkus, R. et al., High-Resolution Tensor MR Elastography for Breast Tumour Detection. Phys Med Biol 2000; 45:1649-1664.
Smith, S.M. et al., Advances in Functional and Structural MR Image Analysis and Implementation as FSL. NeuroImage 2004; 23:S208-S219.
Smith, SM, Fast Robust Automated Brain Extraction. Hum Brain Mapp 2002;17:143-155.
Streitberger, et al., "High-Resolution Mechanical Imaging of Glioblastoma by Multifrequency Magnetic Resonance Elastography", 2014, 9 pages.
Streitberger, K-J et al., "Sack I. In Vivo Viscoelastic Properties of the Brain in Normal Pressure Hydrocephalus," NMR Biomed 2011; 24:385-392.
Streitberger, K-J et al., Brain Viscoelasticity Alteration in Chronic-Progressive Multiple Sclerosis. PLoS One 2012; 7:e29888.
Sutton, et al., "Fast, Iterative Image Reconstruction for MRI in the Presence of Field Inhomogeneities", 2003, 11 pages.
Van, AT et al., K-Space and Image-Space Combination for Motion-Induced Phase-Error Correction in Self-Navigated Multicoil Multishot DWI. IEEE T Med Imaging 2009; 28:1770-1780.
Van Dommelen, JAW et al., "Mechanical Properties of Brain Tissue by Indentation: Interregional Variation," J Mech BehavBiomed 2010;3:158-166.
Van Houten, DVR et al., Subzone Based Magnetic Resonance Elastography Using a Rayleigh Damped Material Model. Med Phys 2011;38:1993-2004.
Van Houten, EEW et al., Three-Dimensional Subzone-Based Reconstruction Algorithm for MR Elastography. Magn Reson Med 2001;45:827-837.
Wang, H. et al., A Three-Dimensional Quality-Guided Phase Unwrapping for MR Elastography. Phys Med Biol 2011; 56:3935-3952.
Wong, Eric, "Optimized phase schedules for minimizing peak RF power in simultaneous multi-slice RF excitation pulses", 2012, 1 page.
Wuerfel, et al., "MR-elastography reveals degradation of tissue integrity in multiple sclerosis", 2010, 6 pages.
Wuerfel, J. et al., "MR-Elastography Reveals Degradation of Tissue Integrity in Multiple Sclerosis," NeuroImage 2010;49:2520-2525.
Zahneisen, et al., "Three-Dimensional Fourier Encoding of Simultaneously Excited Slices: Generalized Acquisition and Reconstruction Framework", 2014, 11 pages.

* cited by examiner

300

| Region | | 2.0 mm [kPa] | 1.6 mm [kPa] |
|---|---|---|---|
| Cerebrum | WM | 2.57 | 2.60 |
| | GM | 2.16 | 2.11 |
| Cerebellum | WM | 2.18 | 2.20 |
| | GM | 1.91 | 1.80 |
| Brainstem | | 3.01 | 3.57 |

THREE DIMENSIONAL MULTISLAB, MULTI-SHOT MAGNETIC RESONANCE ELASTOGRAPHY

CROSS-REFERENCE TO RELATED APPLICATIONS

This application is a National Stage of and claims priority to PCT Application Serial Number PCT/US14/050152, filed Aug. 7, 2014, which claims priority to U.S. Patent Application Ser. No. 61/898,053 filed Oct. 31, 2013. The contents of the foregoing are hereby incorporated by reference into this application as if set forth herein in full.

FIELD OF THE DISCLOSURE

The subject disclosure relates to a method and system for performing three dimensional multislab, multishot magnetic resonance elastography.

BACKGROUND OF THE DISCLOSURE

Identifying mechanical properties of tissues (e.g., brain, liver, breast and so forth) or other samples can be useful for a number of purposes including diagnosis. Mechanical palpation of the tissue can be utilized, but is not an accurate technique and can be invasive depending on the tissue that is being analyzed.

Magnetic Resonance (MR) techniques are being employed for various imaging purposes. However, not all types of MR technique are suitable for every purpose. The type of MR technique and/or the type of sample being analyzed can affect the quality of the images, as well as other factors such as capture time.

BRIEF DESCRIPTION OF THE DRAWINGS

Reference will now be made to the accompanying drawings, which are not necessarily drawn to scale, and wherein.

DETAILED DESCRIPTION OF THE DRAWINGS

Figure 1:
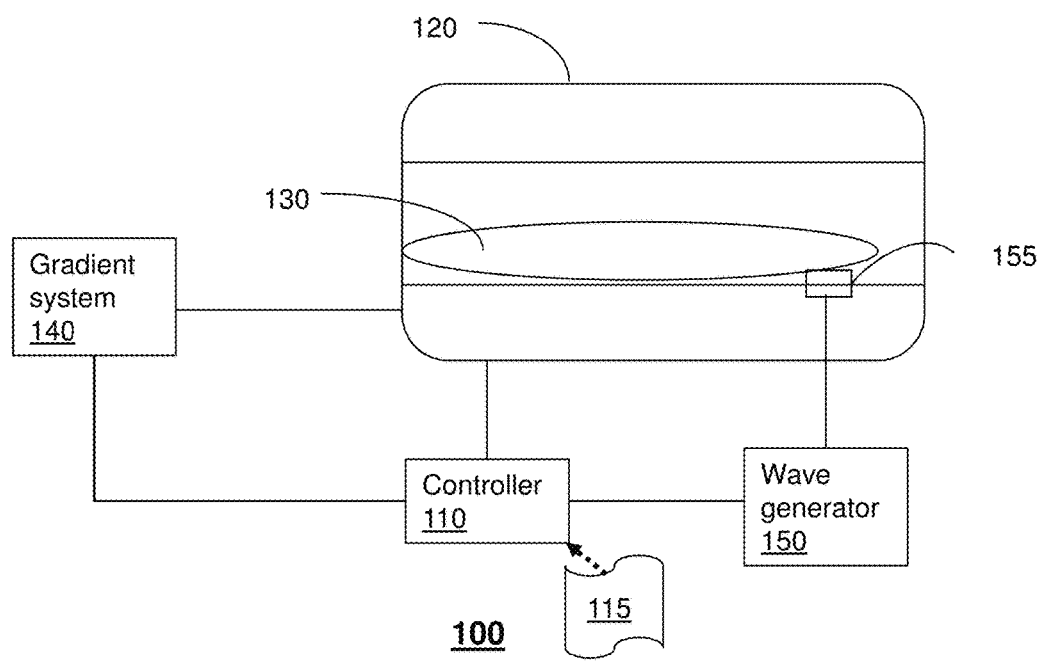
FIG. 1 depicts an illustrative embodiment of a system that performs a three dimensional multislab, multi-shot magnetic resonance elastography acquisition.

The subject disclosure describes, among other things, illustrative embodiments for providing multislab, multi-shot Magnetic Resonance Elastography (MRE). In one or more embodiments, MRE can be utilized as a non-invasive technique, such as for measuring focal mechanical properties of samples (e.g., brain tissue in vivo).

The application of MRE to various samples can be beneficial. For instance, MRE can be utilized to study the brain where mechanical properties of brain parenchyma are very sensitive to neurological disease state. The exemplary embodiments can be used for distinguishing specific microstructural tissue characteristics through the mechanical properties. The exemplary embodiments enable local property estimation by specific neuroanatomical regions, including individual white matter tracts and lobes of the brain. Measuring local properties in relevant brain regions may improve the sensitivity and specificity of MRE measures in the investigation of neurological conditions.

The exemplary embodiments enable capturing full vector field shear wave propagation with high spatial resolution and SNR via the collection of a significant amount of imaging data in a single procedure. The exemplary embodiments can avoid imaging coverage in the slice direction being compromised due to scan time, and further avoids reduced spatial resolutions for whole brain imaging. The exemplary embodiments can provide for capturing of whole-brain displacement data at high resolution to investigate the local mechanical properties of structures throughout large portions of the central nervous system. Other embodiments are described in the subject disclosure.

One embodiment of the subject disclosure is a method of magnetic resonance elastography. The method can include applying, by a system including a processor, a first refocusing pulse to a sample, where the sample is divided into a plurality of slabs that each include a plurality of slices. The method can include applying, by the system, first and second motion encoding gradients to the sample, where the first motion encoding gradient is applied before the first refocusing pulse, and where the second motion encoding gradient is applied after the first refocusing pulse. The method can include providing a gradient blip to define a sample plane and acquiring, by the system, an in-plane k-space shot after the second motion encoding gradient is applied and after the gradient blip is provided. The method can include repeating the applying of the first refocusing pulse, the applying of the first and second motion encoding gradients and the acquiring of the in-plane k-space shot over the plurality of slabs to obtain three dimensional multislab, multishot data.

One embodiment of the subject disclosure includes a system having an actuator for applying a vibration to a sample, a magnetic resonance system for facilitating applying magnetic resonance elastography to the sample, a processor coupled with the actuator and the magnetic resonance system, and a memory that stores executable instructions. The processor, responsive to executing the instructions can facilitate performance of operations including providing a gradient blip to define a sample plane and acquiring in-plane k-space shots over a volume of a sample divided into a plurality of slabs that each include a plurality of slices to obtain three dimensional multislab, multishot data. The processor can apply refocusing pulses to the sample and can acquire navigators after the refocusing pulses. The processor can correct for phase errors based on an averaging of the navigators.

One embodiment of the subject disclosure includes a computer-readable storage device comprising computer instructions which, responsive to being executed by a processor, facilitate performance of operations, including applying a first refocusing pulse to a sample that is divided into a plurality of slabs that each include a plurality of slices. The instructions enable applying first and second motion encoding gradients to the sample, where the first motion encoding gradient is applied before the first refocusing pulse, and where the second motion encoding gradient is applied after the first refocusing pulse. The instructions enable providing a gradient blip to define a sample plane. The instructions enable acquiring an in-plane k-space shot after the second motion encoding gradient is applied. The instructions enable repeating the applying of the first refocusing pulse, the applying of the first and second motion encoding gradients and the acquiring of the in-plane k-space shot over the plurality of slabs of the sample to obtain three dimensional multislab, multishot data.

In one embodiment, parameters for the sample (e.g., a tissue relaxation time) can be determined and a repetition time for the 3D acquisition sequence can be calculated according to the parameters. For example, brain tissue can be scanned with the 3D process utilizing a first repetition time due to the tissue relaxation properties of the brain tissue while liver tissue can be scanned with the 3D process utilizing a second repetition time due to the tissue relaxation properties of the liver tissue. Other variables or features of the 3D process can be adjusted based on the type of sample being scanned such as determining the number of slabs and/or the number of slices according to the tissue relaxation time of the particular sample or according to the overall volume of the particular sample.

Referring to FIG. 1, a system 100 is illustrated that can be utilized for performing MRE, and in particular a three dimensional multislab, multi shot MRE. System 100 can include various hardware and software for performing the MRE and/or data correction, including controller 110, computer instructions 115 (e.g., embodied in a computer-readable storage device), an MRE unit 120 for the sample 130 (e.g., a patient having an organ examined such as brain tissue), a gradient system 140, a wave generator 150 and an actuator 155. System 100 can include various other components not shown in FIG. 1 and/or can include less than all of the components shown in FIG. 1.

System 100 enables a multislab, multishot acquisition for MRE that provides whole imaging coverage (e.g., a whole brain) and high spatial resolution. The multislab approach allows for improved SNR through high SNR efficiency. High SNR efficiency can be provided by way of a balance of $T_1$ signal recovery with the number of volume excitations, and can be provided at a relatively short repetition time (TR), such as approximately 1.5 times the tissue $T_1$ value, although other values can be utilized by the exemplary embodiments. The division of whole-sample coverage (e.g., whole-brain coverage) into multiple volumes provides significant flexibility in TR and access to this balance to achieve high SNR efficiency. This high efficiency can enable data undersampling to reduce scan time while still maintaining adequate SNR for MRE.

In one embodiment, a multislab, multishot MRE acquisition was utilized to generate whole-brain, full vector field displacement data with 2.0×2.0×2 0 mm³ isotropic spatial resolution in six minutes, which resulted in high quality mechanical property maps estimated with NonLinear Inversion (NLI). The exemplary embodiment provided an improved SNR afforded by the 3D multislab approach as measured by the octahedral shear strain-based SNR (OSS-SNR) as compared to 2D data acquisition. The exemplary embodiments can be used for acquiring a dataset with increased resolution (e.g., 1.6×1.6×1.6 mm³).

MRI systems divide the total imaging volume into thin slices that are sampled with a 20 k-space. Since each slice can be excited sequentially in a single TR, this can cover a volume without much penalty in time. When larger coverage is needed the TR can be made longer to accommodate the increased number of slices, but this has the effect of increasing the total acquisition time, though without much increase in SNR as TR becomes much greater than the tissue T1-relaxation value:

$$SNR_{T_1} \propto 1 - 2e^{-\frac{(TR-TE/2)}{T_1}} + e^{\frac{TR}{T_1}} \quad (1)$$

In whole-brain acquisitions with high-resolution, where many slices are needed for full coverage, this approach often results in TRs as long as 10 seconds. Since the $T_1$ of brain tissue is between 1 and 2 seconds, the extra time spent acquiring data with such a long TR provides minimal SNR benefit.

Instead of 2D slice sampling with long TRs, acquisitions can sample the entire volume with a 3D k-space. 3D sampling can utilize multiple excitations, $N_{ex}$, of the same imaging volume that contribute to the SNR of the acquisition:

$$SNR_{ex} \propto \sqrt{N_{ex}} \quad (2)$$

Large volumes for whole-brain coverage can use many excitations to achieve high resolution in the slice direction, though the volume may only be excited once per TR. This approach is slow as there may be a significant waiting period in each TR after the necessary gradients and RF pulses are applied. Minimizing this downtime and overcoming the resulting long acquisition time may require a very short TR, which decreases acquisition SNR from lack of sufficient $T_1$ recovery.

In the discussion of appropriate imaging volume and sampling strategy it is useful to formulate the tradeoffs in TR and $N_{ex}$, in terms of SNR efficiency, $\eta_{SNR}$ defined as the ratio of SNR to the square root of total acquisition time equal to TR·$N_{ex}$, with the in-plane k-space trajectory fixed:

$$\eta_{SNR} \propto \frac{SNR_{T_1} \cdot SNR_{ex}}{\sqrt{TR \cdot N_{ex}}} \quad (3)$$

After substituting the expression from Eqs. (1) and (2), TR, TE, and the tissue $T_1$ value determine SNR efficiency:

$$\eta_{SNR} \propto \frac{1 - 2e^{-\frac{(TR-TE/2)}{T_1}} + e^{\frac{TR}{T_1}}}{\sqrt{TR}} \quad (4)$$

Figure 2:
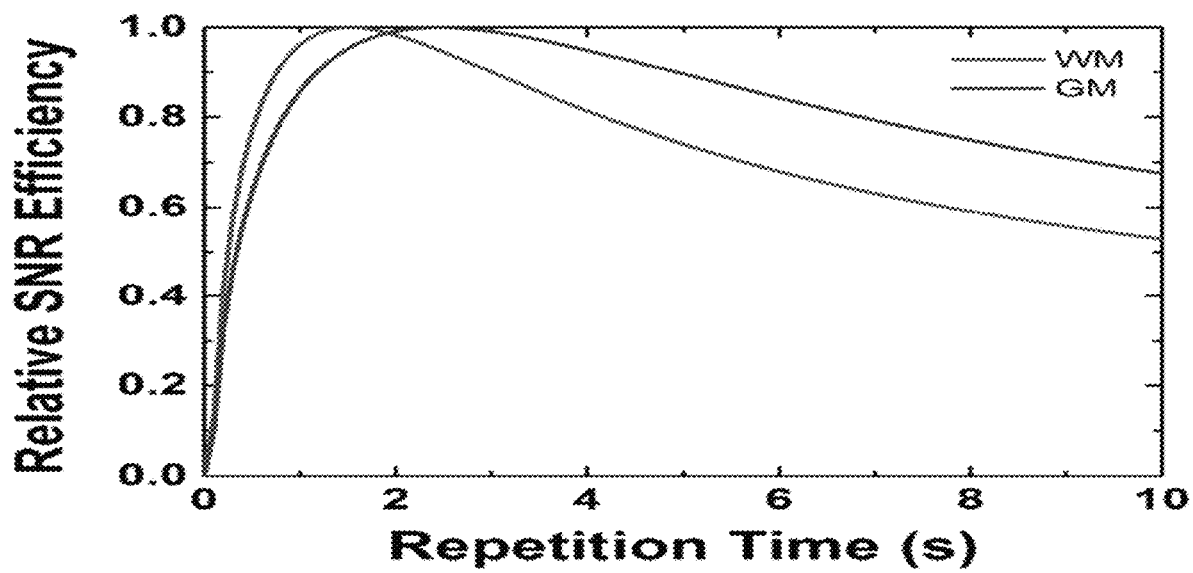
FIG. 2 depicts a graph for relative SNR efficiency of white and grey matter according to repetition time.

Referring to FIG. 2, the relative SNR efficiency is plotted as a function of TR for both white and gray matter using Eq. (4). SNR efficiency can be defined as the ratio of SNR to the square root of total acquisition time. For white matter and gray matter, which have $T_1$ values at 3T of 1084 and 1820 ms, maximum SNR efficiency occurs with TRs of approximately 1500 and 2400 ms, respectively. These optimal TRs can be calculated with a TE of 73 ms.

Maximizing SNR efficiency by choosing an optimal TR may not directly reduce the long scan times necessary for whole-brain coverage with high spatial resolution. However, the surplus of SNR afforded by the improved efficiency can allow for the use of fewer motion encoding time points and incorporation of parallel imaging to reduce acquisition time while maintaining an adequate SNR for MRE inversion.

The multislab, multishot acquisition of the exemplary embodiments can generate MRE data with whole-sample (e.g., whole-brain) coverage by dividing the total imaging volume into multislice slabs. The reduced number of imaging volumes can allow for the use of a short TR and thus high SNR efficiency. A stack-of-spirals trajectory samples the 3D k-space, of each slab, with spiral shots distributed in-plane ($k_x$, $k_y$) and blipped encoding in $k_z$. Multiple interleaved k-space shots can reduce field inhomogeneity distortions and $T_2^*$-induced blurring through short readout durations.

Figure 3:
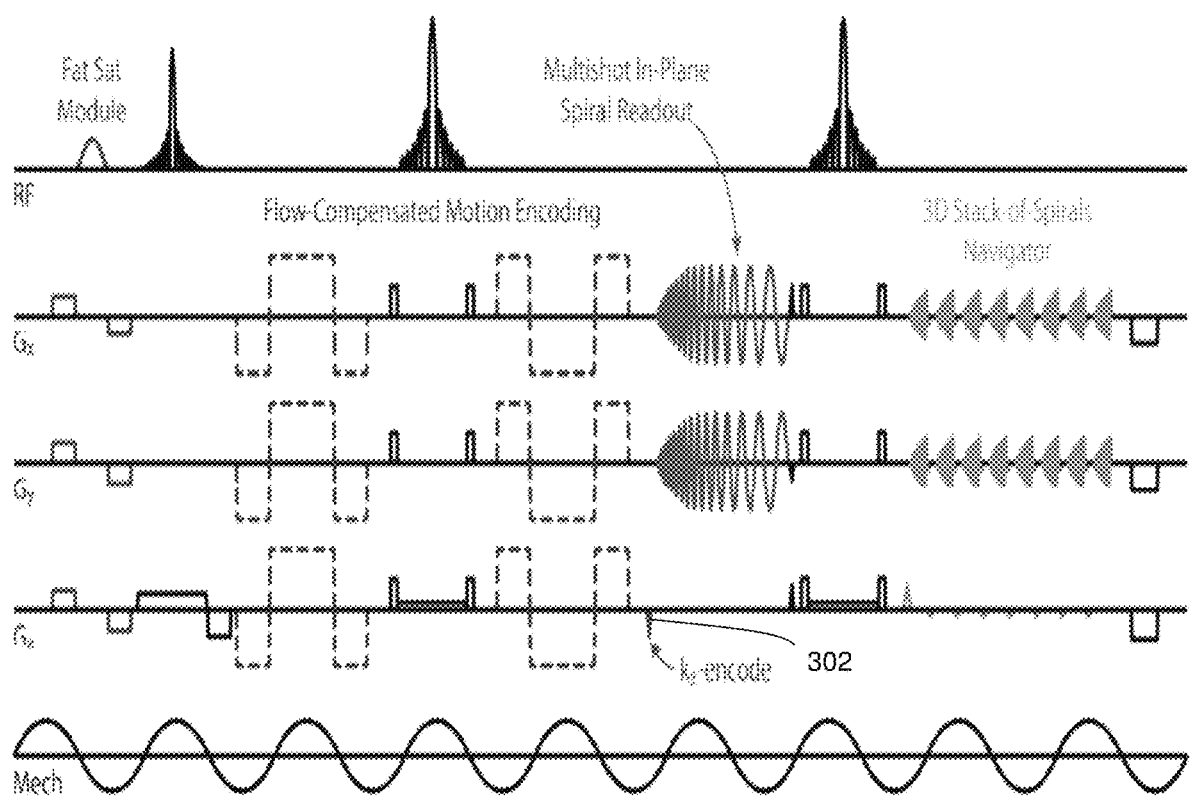
FIG. 3 depicts an illustrative embodiment of magnetic resonance elastography sequence for the system of FIG. 1.

FIG. 3 illustrates a pulse sequence diagram 300 where motion-encoding gradients can be applied on either side of the refocusing pulse and a single k-space shot can be acquired in each excitation. In one embodiment, gradient blips 302 can be provided before the in-plane readouts to define the sampled $k_z$ plane. In one embodiment, the total number of excitations per volume can be equal to the number of acquired in-plane k-space shots times the number of slices per slab.

As an example of an implementation of the 3D multislab, multishot acquisition methodology, ten slabs of eight 2.0 mm thick slices and TR/TE=1800/73 ms can be employed. In one or more embodiments, slabs can be interleaved and/or overlapped (e.g., by at least 25%—although other overlap values can be utilized) to reduce slab boundary artifacts. In one embodiment some or all of the overlapped slices can be discarded. In this embodiment, 120 mm of total coverage is provided in the superior-inferior direction. The 120×120 in-plane matrix can fill a square field-of-view of 240 mm with 2.0×2.0×2.0 mm³ isotropic voxel size. In-plane k-space sampling can be utilized that uses a single 20 ms constant-density spiral trajectory (R=3). In one embodiment, the number and/or size of slabs and/or slices can be chosen based on a number of factors including attaining coverage of key structures of the sample (e.g., key brain structures), SNR efficiency for white and gray matter, total scan time, and/or necessary timing of each excitation block for compatibility with MRE encoding.

Correction for motion-induced phase error caused by shot-to-shot variations in acquired phase can be employed. These errors can result from rigid body motions due to inconsistencies in the applied motion, and can include bulk phase differences and k-space trajectory shifts that result in signal loss and artifacts when shots are combined during image reconstruction. Acquisitions that utilize shots distributed throughout a 3D k-space may utilize an appropriate navigator acquisition to correct for trajectory shifts in $k_x$, $k_y$, and kz. The exemplary embodiment of the imaging sequence can include acquisition of the navigator volume as a low-resolution, single-shot stack-of-spirals after a second refocusing pulse. In this example, this can occur at an echo time of 130 ms as shown in FIG. 3. For instance, each navigator can cover the slab field-of-view with a 15×15×8 matrix for a resolution of 16.0×16.0×2.0 mm³.

In MRE, the desired displacement signal may be encoded in the image phase and hence, standard DWI correction may remove part of the useful MRE signal. In one or more exemplary embodiments, the phase error correction for multishot MRE can use an average of all or some navigators acquired for a volume as the reference for that volume. The number of navigators for each volume can be equal to the number of excitations. In one embodiment, phase offsets and/or trajectory shifts can be calculated using maximum likelihood estimation relative to this averaged reference.

The exemplary sequence 300 provides a 3D multislab, multishot MRE acquisition. Flow-compensated motion encoding gradients are applied on either side of the refocusing pulse and before the in-plane spiral readouts gradients. The 3D k-space trajectory is a stack-of-spirals with $k_z$-encoding blips played before the spiral readout. Following a second refocusing pulse, a low-resolution 3D navigator is acquired as a single-shot stack-of-spirals for motion-induced phase error correction.

EXAMPLE

MRE displacement data was acquired on three healthy subjects (male; 26-28 years old) to demonstrate the performance of the 3D multishot, multislab sequence of system 100 utilizing sequence 300. Scanning was performed utilizing a Siemens 3T TIM Trio MRI scanner (Siemens Medical Solutions; Erlangen, Germany) with a 12-channel head coil. The 3D multislab, multishot pulse sequence included flow-compensated gradients to encode 50 Hz displacements in the brain generated with a remote actuation system. Imaging was repeated to encode motion along each of the three gradient axes separately, with both positive and negative polarities, and at four time points spaced over a single vibration period. The acquisition generated full vector field, complex displacement data at 2.0×2.0×2 0 mm³ isotropic spatial resolution in a total scan time of six minutes.

To demonstrate the improvement in SNR efficiency, an additional dataset was acquired using a 2D sampling technique on one subject in the same imaging session as the 3D multislab acquisition. Sixty slices of 2.0 mm thickness generated the same 120 mm coverage and required a TR of 10,800 ms. In-plane k-space sampling used the same spiral trajectory and reduction factor (R=3), and all other imaging parameters remained the same as in the 3D multislab acquisition. A navigator was also acquired in the 2D acquisition. Because there was no overlap of slabs, and thus no acquired data to be discarded, the total 2D acquisition time was 4 min 30 s.

A 3D multislab, multishot sequence was also utilized to acquire a dataset at higher spatial resolution on one subject for comparison with results from 2 mm displacement data. An increased 150×150 in-plane matrix size was used on the 240 mm field-of-view, along with 1.6 mm thick slices, for an isotropic 1.6×1.6×1.6 mm³ spatial resolution. The higher in-plane resolution required longer data sampling times, and two spiral interleaves (R=2) were used to maintain a 20 ms readout duration. All other imaging parameters were the same, including TE and TR, and the total acquisition time was 11 min 45 s.

Iterative image reconstruction of each dataset was performed using IMPATIENT MRI toolset on graphics processing units (GPUs). The reconstruction incorporated phase offsets and k-space trajectory shifts for motion correction, sensitivity encoding (SENSE), and field inhomogeneity correction with an independently acquired fieldmap. An NLI algorithm was used to estimate the viscoelastic storage and loss moduli, G' and G'', from each displacement dataset.

The imaging protocol also included a high-resolution T1-weighted MPRAGE acquisition (1.0×1.0×1.0 mm³; TR/TI/TE=1900/900/2.3 ms) and T$_2$-weighted acquisition (2.0×2.0×2 0 mm³ TR/TE=10500/93 ms) co-registered with the MRE dataset. All segmentation analysis used the T1-weighted data in in FSL with the MNI structural atlas and Harvard-Oxford structural atlas following a procedure outlined previously. Masks were created for investigating white and cortical gray matter (WM and GM) of the cerebrum and cerebellum, as well as the brainstem.

The multislab, multishot acquisition generated whole-brain displacement data with high SNR, as characterized by the octahedral shear strain-based SNR measure (OSS-SNR). The average OSS-SNR of the three datasets acquired was 4.19, with every dataset above the minimum of 3.0 needed for inversion.

Figure 4:
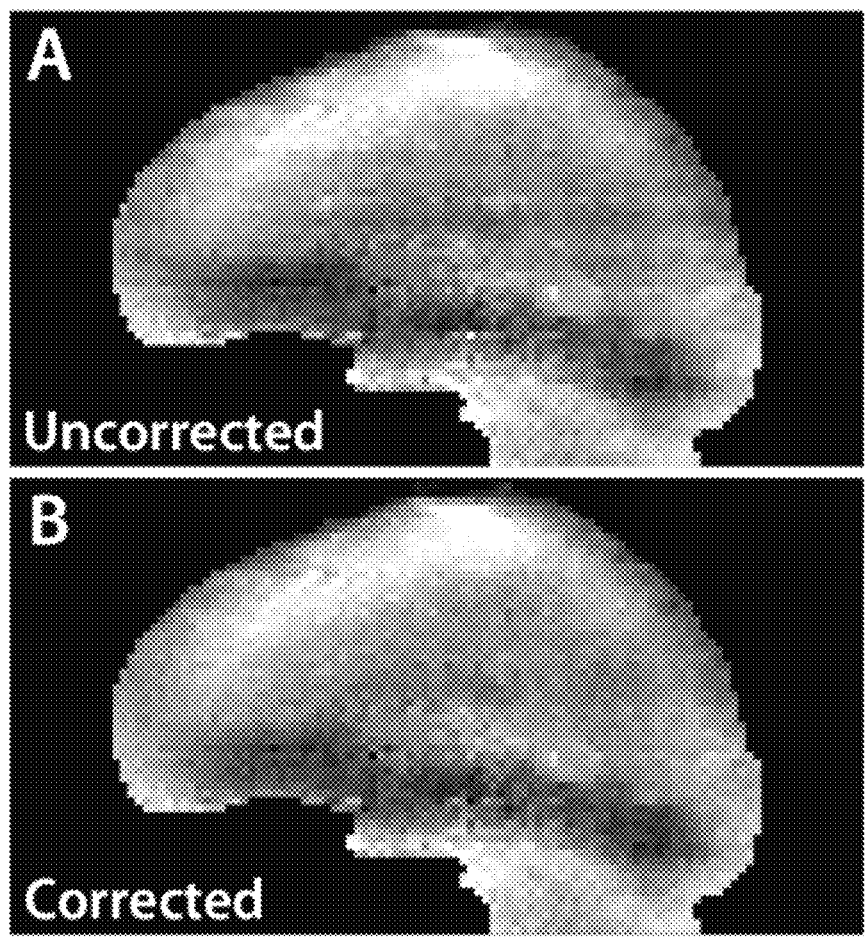
FIGS. 4A and 4B depict uncorrected and corrected images for data acquired by the system of FIG. 1 and sequence of FIG. 3.
Figure 5:
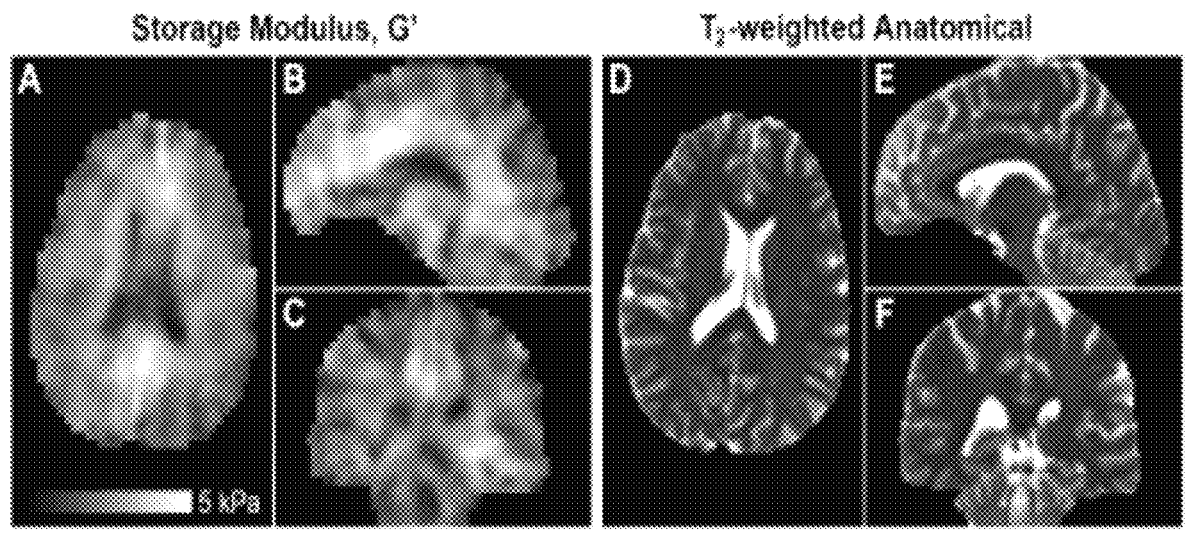
FIG. 5A-F depicts images for storage modulus and T2 weighted anatomical according to data acquired by the system of FIG. 1 and sequence of FIG. 3.

Referring to FIGS. 4A-B, correction for motion-induced phase error, improves the quality of phase data. Uncorrected and corrected sagittal reformatting can be performed of a single time point with y-encoding after subtraction. The uncorrected dataset shows reduced SNR and slab-to-slab phase inconsistencies, while the smooth phase after correction indicates reduced errors and improved SNR.

In generating high quality MRE data with a multishot acquisition, correction for motion-induced phase errors was applied. FIG. 4A provides an example of phase from data reconstructed without phase error correction. Clearly visible are increased noise and disjointed phase from slab-to-slab, which indicates phase artifacts present in the individually reconstructed slabs. FIG. 4B presents the same data with motion-induced phase error correction included in the reconstruction and shows smooth phase with a clear increase in SNR.

Whole-brain mechanical property maps generated from the exemplary embodiment in this example reveal many features that agree well with neuroanatomy. Referring to FIGS. 5A-F, whole-brain storage modulus map, G', from inversion of MRE displacement data captured with the 3D multislab, multishot acquisition is illustrated: (A) one axial slice and (B) sagittal and (C) axial reformats, along with (D-F) corresponding T$_2$-weighted images illustrating the excellent agreement between storage modulus and neuroanatomical features. These property maps demonstrate sharp definition on cortical sulci and lateral and fourth ventricles. Also visible are the soft cerebellum on B and C, and the stiff brainstem in B. FIGS. 5A-F present the storage modulus from one subject along with the corresponding T2-weighted images. Regions of cerebrospinal fluid are sharply delineated, as expected, including cortical sulci and the lateral and fourth ventricles. Also visible are the softer cerebellum and stiffer brainstem. On average, white matter is softer in the cerebellum than the cerebrum (G': 2.22 vs. 2.57 kPa), as is gray matter (G: 1.96 vs. 2.18 kPa). These results agree with previous reports of cerebellar properties from MRE. The brainstem is much stiffer than white matter in either the cerebrum or cerebellum, with an average G' value of 3.00 kPa, which is expected given its tight, highly aligned fiber structure.

Referring to FIGS. 6A-D, a comparison of MRE data from 3D multislab acquisition with equivalent 2D acquisition from the same subject in the same imaging session. Single slice of z-motion captured with (A) 2D and (B) 3D multislab acquisitions. The data acquired in 2D is much noisier and has an OSS-SNR value below the minimum needed for inversion. Storage modulus maps from data acquired with (C) 2D and (D) 3D multislab acquisitions demonstrate the effect of excessive noise on the inversion.

Figure 6:
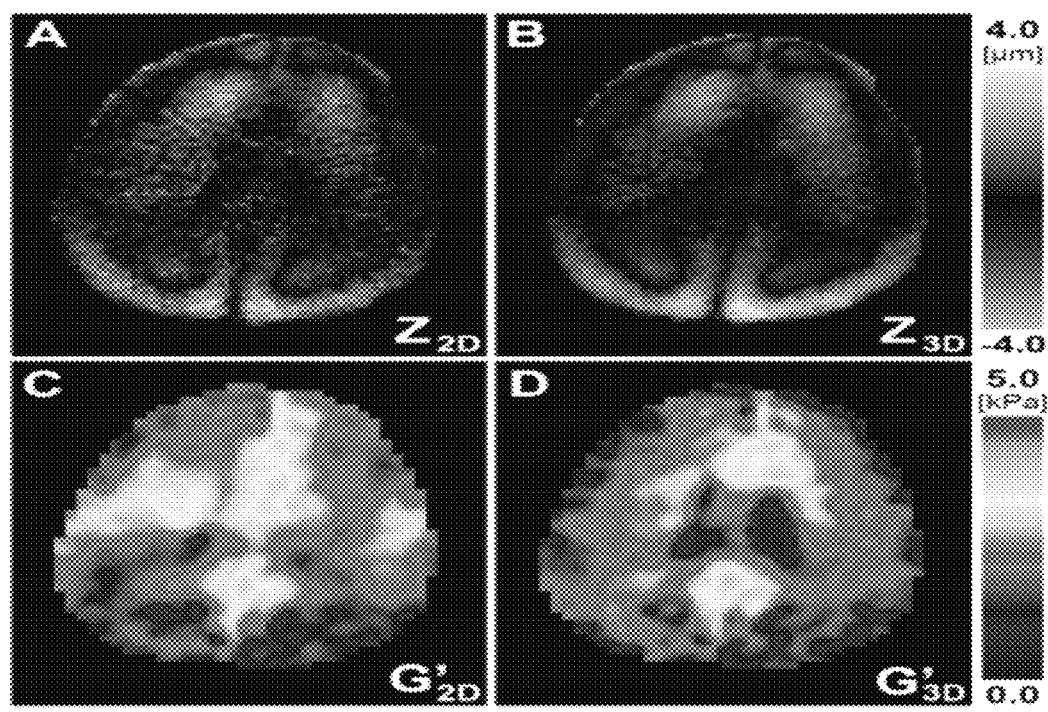
FIG. 6A-D depicts images for data acquired by a two dimensional MRE system compared with images from data acquired by the system of FIG. 1 and sequence of FIG. 3.

The 2D acquisition produces largely corrupted properties while the 3D multislab results are of high quality. FIGS. 6A-D presents displacement fields and storage modulus maps from the same slice of data acquired in 2D and 3D on the same subject. The displacement data shows nearly identical deformation patterns, though the 2D acquisition resulted in significantly decreased SNR. The OSS-SNR of the 2D dataset is 2.52, which is below the minimum needed for inversion, while the OSS-SNR of the 3D dataset is 3.84. FIGS. 6C-D present the storage modulus estimated from the two acquisitions with NLI, with the 2D data resulting in poor property maps due to low OSS-SNR.

Figures 7, 8:
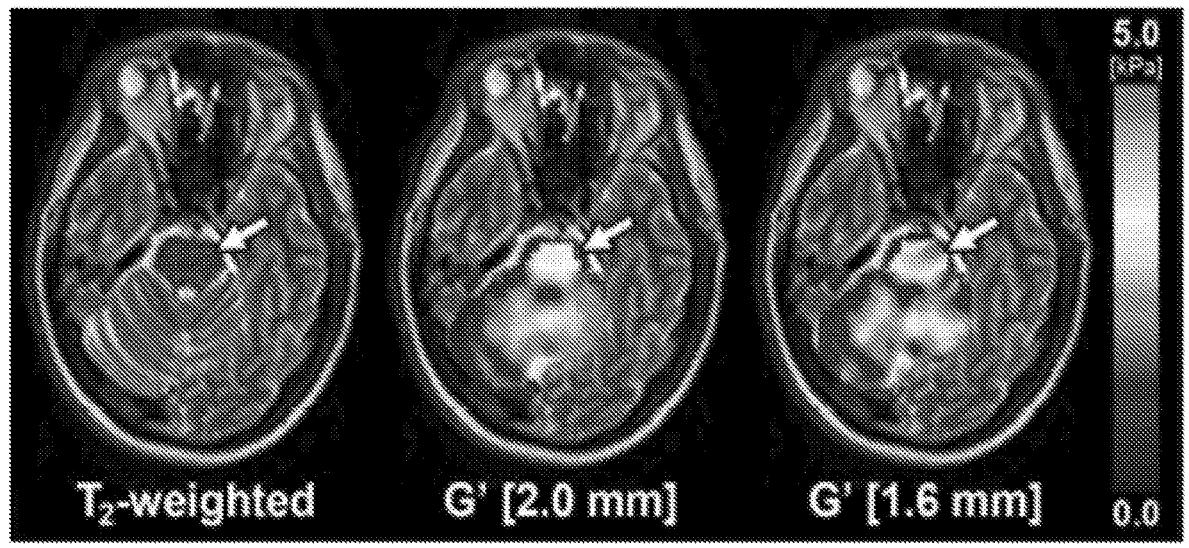
FIG. 7 depicts a table for average storage modulus, G', for different brain tissue types of the same subject, estimated from MRE acquisitions with 2.0 mm and 1.6 mm isotropic spatial resolutions.
FIG. 8 depicts images for storage modulus maps according to data acquired by the system of FIG. 1 and sequence of FIG. 3.

FIG. 7 illustrates table 1 which is a collection of the storage modulus of the cerebrum, cerebellum, and brainstem of the same subject assessed with both 1.6 and 2.0 mm spatial resolutions, for comparison. The 1.6 mm acquisition produced storage modulus estimates of cerebral WM and GM that are very similar to those from the 2.0 mm acquisition, and the same is true of cerebellar WM and GM properties. On the other hand, the 1.6 mm acquisition returned an estimated stiffness for the brainstem that is significantly higher than estimated with the lower resolution (3.57 vs. 3.01 kPa).

FIG. 8 presents co-registered storage modulus estimates from both resolutions demonstrating the similar cerebellar profiles and differences in the brainstem. FIG. 8 illustrates storage modulus maps of the brainstem and cerebellum calculated from data with 2.0×2.0×2.0 mm³ and 1.6×1.6×1.6 mm³ isotropic spatial voxel sizes after co-registration to the T$_2$ weighted anatomical images. While the property distributions in the cerebellum are very similar between the two resolutions, with somewhat more detail available from the 1.6 mm data, the brainstem appears as significantly stiffer at higher resolution. The calculated average G of the brainstem is 3.01 kPa from 2.0 mm data, and 3.57 kPa from 1.6 mm data.

The 3D multislab, multishot acquisition scheme of the exemplary embodiment captured MRE displacement data by using multiple 3D volumes that cover the entire brain. The sample in this example was the brain, however, other organs or other materials can be utilized as the same. The small number of imaging volumes does not require a long TR, and thus high SNR efficiency can be achieved. This high SNR efficiency allows for the reduction of total acquisition time while maintaining adequate SNR necessary for inversion. Scan time was reduced by undersampling in both k-space and MRE time domains. The use of parallel imaging, reduced the acquisition time by a factor of 3 and the SNR by a factor of √3, along with a g-factor penalty based on the object and receiver coil geometries.

Additionally in this example, only four samples of the vibration were captured, as opposed to the typical eight of most MRE acquisitions. This halves the total acquisition time, but also reduces the SNR by a factor of √2. Despite the reduced acquisition time, the 3D multislab, multishot sequence generated whole-brain MRE datasets with adequate SNR. The total acquisition time of six minutes provides a fast MRE acquisition that generates whole-brain, full vector field displacements with 2.0×2.0×2.0 mm³ isotropic spatial resolution.

Motion-induced phase errors can lead to signal cancellation and artifacts in multishot acquisitions. A correction procedure may be applied to recover SNR and minimize artifacts in the phase images. In one or more embodiments, correcting the slab-to-slab phase inconsistencies can be performed in MRE where the underlying tissue properties are estimated from spatial variations in phase. For instance, without proper correction, this type of phase artifact can cause errors in estimated properties on either side of the slab boundary and necessitate spatial filtering, thus reducing the spatial resolution of the property maps.

$k_z$ trajectory shifts occurring in multislab DWI acquisitions can be very small and may not require correction. However, actuation in brain MRE can directly cause head rotations about the magnet x-axis and any amplitude variations will generate k errors in the presence of y-gradients that can be corrected by the exemplary embodiments. Additional sources of rigid body motion can include microscopic subject movement or scanner table vibrations induced by gradient switching. Various correction techniques can be utilized. For example, the correction technique described herein accounts for phase errors induced by rigid body motion. Residual phase errors due to brain motion during cardiac pulsation or shear displacement fields from off-frequency vibrations may persist and may or may not be accounted for by the exemplary embodiments.

The exemplary embodiments provide no perceptible "venetian blind" artifact between slabs in FIG. 4B. This artifact would arise from imperfect RF pulse profiles that cause signal loss at the edges of neighboring slabs, and images associated with the data in FIG. 4A do show this artifact. The reduced magnitude signal at the slab edges can translate to increased phase variance and lower phase SNR. This may not be significant enough to affect the phase images or OSS-SNR calculation. Any additional background phase field associated with the RF pulse profiles can be removed during subtraction of images with opposite encoding polarities.

The improvement in SNR efficiency of the 3D multislab, multishot acquisition is demonstrated by the comparison with the equivalent 2D acquisition in FIGS. 6A-D. Based on the relationship in Eq. 4, it is expected that the 3D acquisition will have 2.25× the SNR of the 2D acquisition in WM and 1.74× in GM. However, the 3D dataset only has a 1.52× improvement in OSS-SNR as averaged over the entire brain. This discrepancy between theoretical and experimental results can stem from the residual phase error caused by non-rigid body motion, as mentioned above. Since the equivalent 2D acquisition in this case is actually a single-shot sequence it is not subject to the signal loss that results from phase errors in multishot sequences. Thus, any additional SNR loss caused by this residual phase error in the 3D multislab, multishot acquisition will decrease the observed SNR margin. Nonetheless, the 2D acquisition used here still has SNR too low for accurate inversion. Note that in practice, a multishot approach would be needed for the 2D acquisition by removing the benefit of parallel imaging to improve the SNR at the expense of increased scan time by at least a factor of 2.

FIGS. 6C-D highlight the importance of maintaining an adequate SNR level in MRE. The excessive noise in the 2D data leads to model/data mismatch during inversion that corrupts the resulting mechanical property maps. The fine features of FIG. 6D, including the lateral ventricles, are almost completely lost in the 2D results of FIG. 6C. This comparison further reinforces the argument that 3D multislab sampling schemes are superior to their equivalent 2D counterparts in applications requiring whole-brain imaging coverage.

The high SNR efficiency of the 3D multislab approach of the exemplary embodiments also affords significant flexibility for developing acquisitions with greater spatial resolution in specific applications. We tested the limits of the 3D acquisition by increasing the spatial resolution to 1.6×1.6× 1.6 mm$^3$ This voxel size has a volume approximately half that of the 2.0 mm acquisition and should reduce the SNR by a factor of two. This loss was partially offset by the longer readout times necessitated by higher in-plane resolution and a parallel imaging factor of only R=2. The resulting OSS-SNR of the dataset was 3.07, which is still above the minimum of 3.0 needed for inversion.

For one or more of the exemplary embodiments, the higher resolution generated slightly greater contrast between WM and GM for both the cerebrum and cerebellum. This is expected given the very thin cortical structure, though the differences across resolution are small and within the measurement uncertainty reported previously for 2.0 mm spatial resolution. However, for the brainstem, which is a very stiff, sharply delineated structure, the higher resolution data is needed to avoid smoothing over the structure and underestimating its stiffness. The comparison in FIG. 8 highlights the importance of pursuing acquisitions at higher resolution to improve the quantitative accuracy of local property measures in brain MRE.

One or more of the exemplary embodiments provides an acquisition scheme for brain MRE based on 3D multislab, multishot imaging. However, the sample can be anything that can be studied via MRE including other human organs or other materials. The exemplary embodiments can improve or maximize SNR efficiency by using an improved or optimal TR based on tissue relaxation times. Incorporation of time reduction methods, such as via parallel imaging, can provide an acquisition capable of capturing whole-brain (or other whole samples) displacement data with 2.0 mm isotropic spatial resolution in six minutes while maintaining adequate SNR for inversion. This acquisition allows the probing of local regions, such as local neuroanatomical regions across the entire brain including the entire length of the corticospinal tracts, the four lobes of the brain and the cerebellum, and deep white and gray matter structures. The SNR efficiency can also provide flexibility through tradeoffs in acquisition parameters to develop targeted acquisitions at even higher resolution for specific applications. By increasing the resolution to a 1.6 mm isotropic voxel size, an improved estimate of the brainstem stiffness can be obtained.

Figure 9:
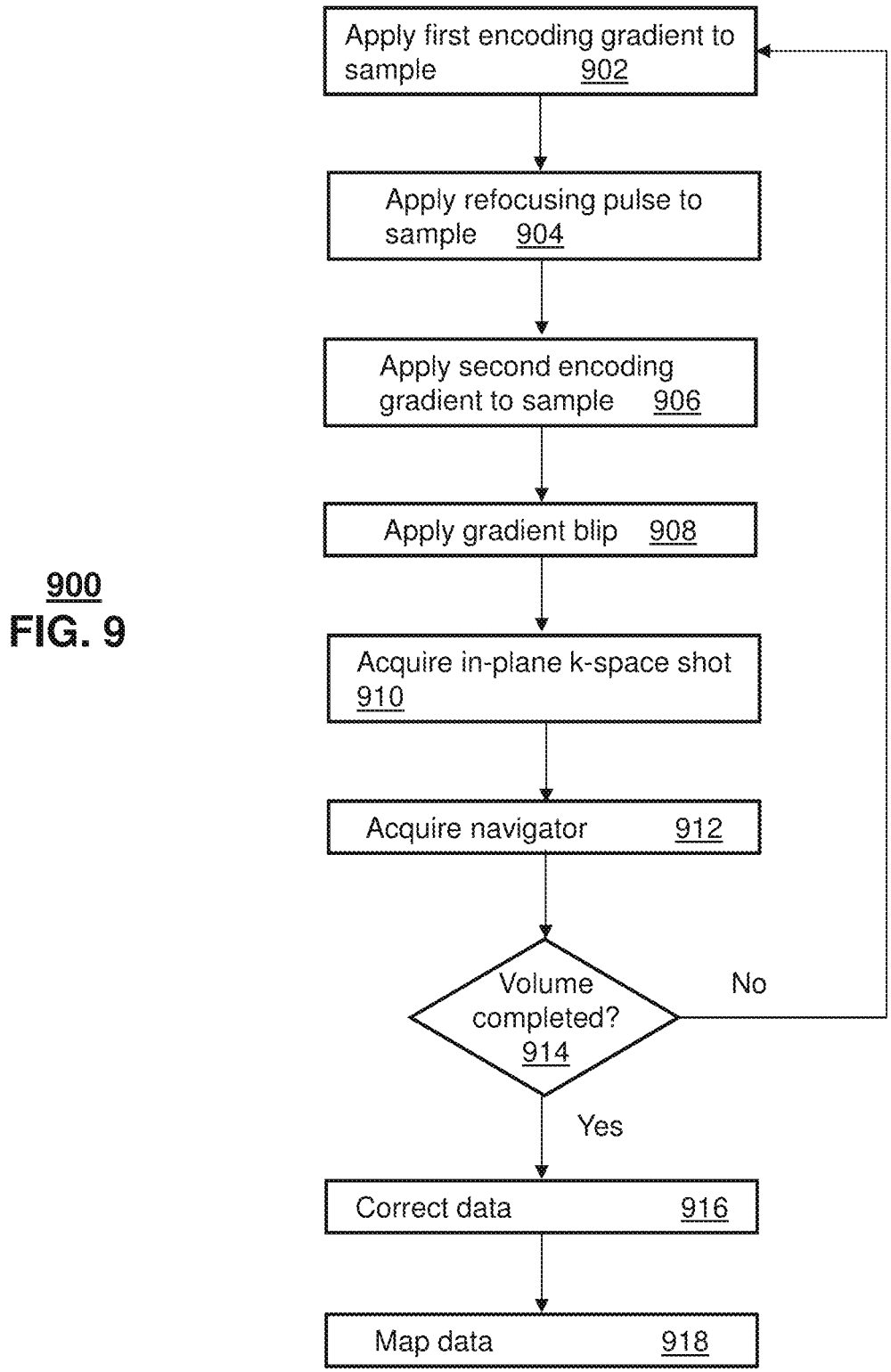
FIG. 9 depicts an illustrative embodiment of a method for performing a three dimensional multislab, multi-shot magnetic resonance elastography acquisition.

FIG. 9 illustrates a method 900 for performing 3D multislab, multishot MRE acquisition on a sample, such as a brain in vivo, although the sample can be other human organs or other objects. The sample can be divided into a plurality of slabs that have a plurality of slices to facilitate the 3D data capture. At 902, a first encoding gradient can be applied to the sample. The gradient can be flow-compensated. At 904, a refocusing pulse can be applied to the sample. At 906, a second encoding gradient can be applied to the sample. The gradient can be flow-compensated. At 908, a gradient blip can be provided to enable defining the sampled $K_z$ plane. At 910, a single k-space shot can be acquired in each excitation resulting in a multi-shot in-plane spiral readout.

At 912, a navigator can be acquired. For example, following a second refocusing pulse a low-resolution 3D navigator can be acquired as a single shot stack-of-spirals for use in motion-induced phase error correction.

At 914, a determination is made as to whether the entire volume has been scanned. If more slabs need to be scanned, then method 900 returns to 902 to apply encoding gradients and acquire k-space shots. If the entire volume has been scanned then at 916, the navigator(s) can be used for motion-induced phase error correction, such as described in U.S. application Ser. No. 14/178,355 filed Feb. 12, 2014, the disclosure of which is hereby incorporated by reference in its entirety. In one embodiment, some or all of the navigators are averaged and the average navigator is utilized in the error correction as a reference for the entire volume of the sample.

The corrected data can then be used in generating maps or other representations of the data at 918. The exemplary embodiments can include other techniques to be utilized with respect to the capturing of the k-space data and/or with respect to the correction of the k-space data, such as described in U.S. Patent Publication 2013/0181712 to Sutton, the disclosure of which is hereby incorporated by reference.

Figure 10:
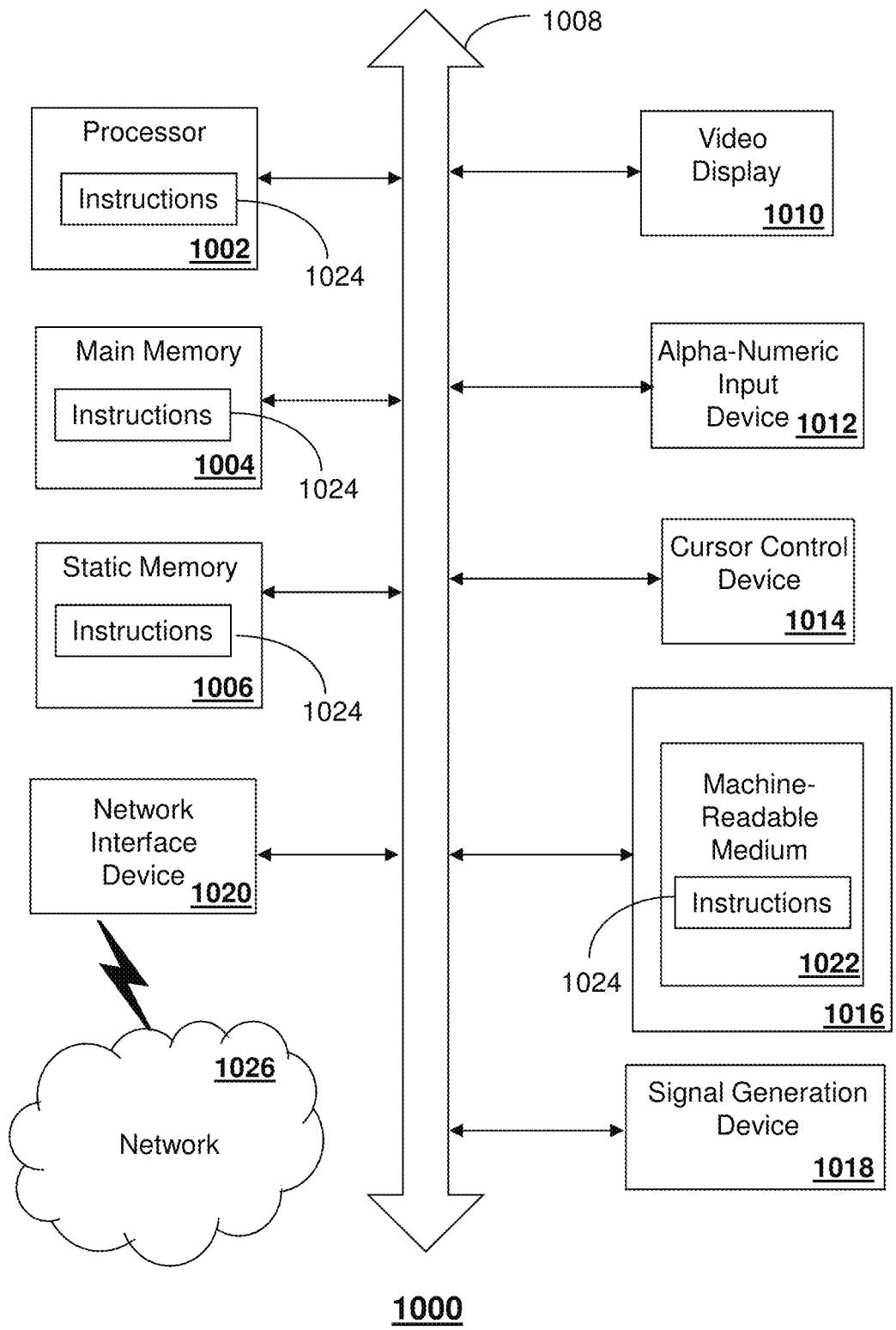
FIG. 10 is a diagrammatic representation of a machine in the form of a computer system within which a set of instructions, when executed, may cause the machine to perform any one or more of the methods described herein.

FIG. 10 depicts an exemplary diagrammatic representation of a machine in the form of a computer system 1000 within which a set of instructions, when executed, may cause the machine to perform any one or more of the methods described above. One or more instances of the machine can operate, for example, as the controller 110, the MRE system 120, the gradient system 140 and the wave generator 150. In some embodiments, the machine may be connected (e.g., using a network 1026) to other machines. In a networked deployment, the machine may operate in the capacity of a server or a client user machine in a server-client user network environment, or as a peer machine in a peer-to-peer (or distributed) network environment.

The machine may comprise a server computer, a client user computer, a personal computer (PC), a tablet, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 1000 may include a processor (or controller) 1002 (e.g., a central processing unit (CPU)), a graphics processing unit (GPU, or both), a main memory 1004 and a static memory 1006, which communicate with each other via a bus 1008. The computer system 1000 may further include a display unit 1010 (e.g., a liquid crystal display (LCD), a flat panel, or a solid state display). The computer system 1000 may include an input device 1012 (e.g., a keyboard), a cursor control device 1014 (e.g., a mouse), a disk drive unit 1016, a signal generation device 1018 (e.g., a speaker or remote control) and a network interface device 1020. In distributed environments, the embodiments described in the subject disclosure can be adapted to utilize multiple display units 1010 controlled by two or more computer systems 1000. In this configuration, presentations described by the subject disclosure may in part be shown in a first of the display units 1010, while the remaining portion is presented in a second of the display units 1010.

The disk drive unit 1016 may include a tangible computer-readable storage medium 1022 on which is stored one or more sets of instructions (e.g., software 1024) embodying any one or more of the methods or functions described herein, including those methods illustrated above. The instructions 1024 may also reside, completely or at least partially, within the main memory 1004, the static memory 1006, and/or within the processor 1002 during execution thereof by the computer system 1000. The main memory 1004 and the processor 1002 also may constitute tangible computer-readable storage media.

Dedicated hardware implementations including, but not limited to, application specific integrated circuits, programmable logic arrays and other hardware devices can likewise be constructed to implement the methods described herein. Application specific integrated circuits and programmable logic array can use downloadable instructions for executing state machines and/or circuit configurations to implement embodiments of the subject disclosure. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the operations or methods described herein are intended for operation as software programs or instructions running on or executed by a computer processor or other computing device, and which may include other forms of instructions manifested as a state machine implemented with logic components in an application specific integrated circuit or field programmable gate array. Furthermore, software implementations (e.g., software programs, instructions, etc.) including, but not limited to, distributed processing or component/object distributed processing, parallel processing, or virtual machine processing can also be constructed to implement the methods described herein. It is further noted that a computing device such as a processor, a controller, a state machine or other suitable device for executing instructions to perform operations or methods may perform such operations directly or indirectly by way of one or more intermediate devices directed by the computing device.

While the tangible computer-readable storage medium 1022 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure. The term "non-transitory" as in a non-transitory computer-readable storage includes without limitation memories, drives, devices and anything tangible but not a signal per se.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth®, WiFi, Zigbee®), and long-range communications (e.g., WiMAX, GSM, CDMA, LTE) can be used by computer system 1000.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. The exemplary embodiments can include combinations of features and/or steps from multiple embodiments. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, can be used in the subject disclosure. In one or more embodiments, features that are positively recited can also be excluded from the embodiment with or without replacement by another component or step. The steps or functions described with respect to the exemplary processes or methods can be performed in any order. The steps or functions described with respect to the exemplary processes or methods can be performed alone or in combination with other steps or functions (from other embodiments or from other steps that have not been described).

Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

In one or more embodiments, a processor (which can include a controller or circuit) has been described that performs various functions. It should be understood that the processor can be multiple processors, which can include distributed processors or parallel processors in a single machine or multiple machines. The processor can be used in supporting a virtual processing environment. The virtual processing environment may support one or more virtual machines representing computers, servers, or other computing devices. In such virtual machines, components such as microprocessors and storage devices may be virtualized or logically represented. The processor can include a state machine, application specific integrated circuit, and/or programmable gate array including a Field PGA. In one or more embodiments, when a processor executes instructions to perform "operations", this can include the processor performing the operations directly and/or facilitating, directing, or cooperating with another device or component to perform the operations.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method of magnetic resonance elastography, the method comprising:
   applying, by a system including a processor, a first refocusing pulse to a sample, wherein the sample is divided into a plurality of slabs that each include a plurality of slices;
   applying, by the system, first and second motion encoding gradients to the sample, wherein the first motion encoding gradient is applied before the first refocusing pulse, and wherein the second motion encoding gradient is applied after the first refocusing pulse;
   providing, by the system, a plurality of gradient blips to define a plurality of sample planes of one of the plurality of slabs;
   acquiring, by the system, a k-space shot after the second motion encoding gradient is applied, wherein the k-space shot is acquired according to a stack of in-plane samples separated according to the plurality of gradient blips to obtain a three-dimensional k-space sample of one of the plurality of slabs; and
   repeating, by the system, the applying of the first refocusing pulse, the applying of the first and second motion encoding gradients and the acquiring of the k-space shot over the plurality of slabs to obtain three dimensional multislab, multishot data.

2. The method of claim 1, further comprising generating, by the system, a modulus map image for the sample according to the three dimensional multislab, multishot data.

3. The method of claim 1, further comprising:
   determining, by the system, a tissue relaxation time for the sample; and
   calculating, by the system, a repetition time according to the tissue relaxation time, wherein obtaining of the three dimensional multislab, multishot data is according to the repetition time.

4. The method of claim 1, further comprising:
   applying, by the system, a second refocusing pulse to the sample after the k-space shot is acquired;

acquiring, by the system, a three-dimensional navigator after the second refocusing pulse is applied, wherein the three-dimensional navigator is acquired as a single-shot stack of spirals; and performing, by the system, a correction for phase errors, the correction being performed based on the three-dimensional navigator.

5. The method of claim 4, wherein the acquiring of the three-dimensional navigator is repeated over the plurality of slabs of the sample to acquire a plurality of three-dimensional navigators, wherein the correction for the phase errors is performed based on the plurality of three-dimensional navigators.

6. The method of claim 5, further comprising:
averaging, by the system, the plurality of three-dimensional navigators, wherein the correction for the phase errors is performed based on the averaging of the plurality of three-dimensional navigators.

7. The method of claim 1, wherein a total number of excitations is equal to a number of acquired k-space shots times a number of slices per slab, and wherein the first and second motion encoding gradients are flow-compensated.

8. The method of claim 1, wherein obtaining of the three dimensional multislab, multishot data includes utilizing parallel imaging of the sample.

9. The method of claim 1, wherein adjacent slabs of the plurality of slabs are overlapped, and wherein data acquired for at least a portion of overlapped slices is discarded.

10. The method of claim 1, wherein the sample is an in vivo brain, wherein adjacent slabs of the plurality of slabs are overlapped by at least 25 percent, and wherein data acquired for at least a portion of overlapped slices is discarded.

11. A system comprising:
an actuator for applying a vibration to a sample;
a magnetic resonance system for facilitating applying magnetic resonance elastography to the sample;
a processing system including a processor coupled with the actuator and the magnetic resonance system; and
a memory that stores executable instructions which, responsive to being executed by the processing system, facilitate performance of operations, the operations comprising:
providing a plurality of gradient blips to define a plurality of sample planes of one of a plurality of slabs;
acquiring a k-space shot over the plurality of sample planes of the one of the plurality of slabs, wherein the plurality of slabs define a volume of the sample, and wherein the one of the plurality of slabs includes a plurality of slices corresponding to the plurality of sample planes;
repeating the acquiring of the k-space shot for each of the plurality of slabs to obtain three dimensional multislab, multishot data;
applying refocusing pulses to the sample;
acquiring three-dimensional navigators after the refocusing pulses; and
correcting for phase errors based on an averaging of the three-dimensional navigators.

12. The system of claim 11, wherein the operations further comprise:
determining a tissue relaxation time for the sample; and
calculating a repetition time according to the tissue relaxation time, wherein obtaining of the three dimensional multislab, multishot data is according to the repetition time.

13. The system of claim 11, wherein the operations further comprise:
performing parallel imaging of the sample to facilitate obtaining of the three dimensional multislab, multishot data.

14. The system of claim 11, wherein a total number of excitations is equal to a number of acquired k-space shots times a number of slices per slab.

15. The system of claim 11, wherein the operations further comprise generating a modulus map image for the sample according to the three dimensional multislab, multishot data.

16. A machine-readable storage device comprising executable instructions which, responsive to being executed by a processing system including a processor, facilitate performance of operations, the operations comprising:
applying a first refocusing pulse to a sample that is divided into a plurality of slabs that each include a plurality of slices;
applying first and second motion encoding gradients to the sample, wherein the first motion encoding gradient is applied before the first refocusing pulse, and wherein the second motion encoding gradient is applied after the first refocusing pulse;
providing a plurality of gradient blips to define a plurality of sample planes of a slab of the plurality of slabs that define a volume of the sample;
acquiring a k-space shot over the plurality of sample planes after the second motion encoding gradient is applied; and
repeating the applying of the first refocusing pulse, the applying of the first and second motion encoding gradients and the acquiring of the k-space shot over the plurality of sample planes of each slab of the plurality of slabs of the sample to obtain three dimensional multislab, multishot data.

17. The machine-readable storage device of claim 16, wherein the operations further comprise:
determining a tissue relaxation time for the sample; and
calculating a repetition time according to the tissue relaxation time, wherein obtaining of the three dimensional multislab, multishot data is according to the repetition time.

18. The machine-readable storage device of claim 16, wherein the operations further comprise:
applying second refocusing pulses to the sample after the k-space shot is acquired;
acquiring three-dimensional navigators after each of the second refocusing pulses are applied;
averaging the three-dimensional navigators; and
correcting for phase errors based on the averaging of the three-dimensional navigators.

19. The machine-readable storage device of claim 16, wherein a total number of excitations is equal to a number of acquired k-space shots times a number of slices per slab.

20. The machine-readable storage device of claim 16, wherein obtaining of the three dimensional multislab, multishot data includes utilizing parallel imaging of the sample.

* * * * *